(12) United States Patent
Chang et al.

(10) Patent No.: US 11,774,472 B2
(45) Date of Patent: Oct. 3, 2023

(54) TRANSFORMER AREA IDENTIFICATION METHOD AND METHOD FOR CONSTRUCTING TRANSFORMER AREA LINE TOPOLOGY

(71) Applicant: BEIJING TENGINEER AIOT TECH CO., LTD., Beijing (CN)

(72) Inventors: Hongshan Chang, Beijing (CN); Guang He, Beijing (CN)

(73) Assignee: BEIJING TENGINEER AIOT TECH CO., LTD., Beijing (CN)

( * ) Notice: Subject to any disclaimer, the term of this patent is extended or adjusted under 35 U.S.C. 154(b) by 0 days.

(21) Appl. No.: 17/753,521

(22) PCT Filed: Sep. 11, 2020

(86) PCT No.: PCT/CN2020/114634
§ 371 (c)(1),
(2) Date: Mar. 6, 2022

(87) PCT Pub. No.: WO2021/043317
PCT Pub. Date: Mar. 11, 2021

(65) Prior Publication Data
US 2022/0341976 A1  Oct. 27, 2022

(30) Foreign Application Priority Data
Sep. 6, 2019 (CN) .......................... 201910843965.X

(51) Int. Cl.
*G01R 21/133* (2006.01)
*G01R 31/08* (2020.01)
*H02J 3/00* (2006.01)

(52) U.S. Cl.
CPC ......... *G01R 21/133* (2013.01); *G01R 31/086* (2013.01); *G01R 31/088* (2013.01); *H02J 3/00* (2013.01)

(58) Field of Classification Search
CPC .................. G01R 19/2513; G01R 31/086; G01R 31/088; G01R 21/133; H02J 3/00
(Continued)

(56) References Cited

U.S. PATENT DOCUMENTS

2013/0107405 A1\* 5/2013 Blumschein ............. H02H 7/26
702/58
2017/0207818 A1   7/2017 Lu et al.

FOREIGN PATENT DOCUMENTS

CN    108564485 A    9/2018
CN    108805457 A    11/2018
(Continued)

OTHER PUBLICATIONS

English machine translation of CN 109344144A published date: Feb. 15, 2019 (Year: 2019).\*

*Primary Examiner* — John H Le
(74) *Attorney, Agent, or Firm* — Bayramoglu Law Offices LLC

(57) ABSTRACT

A transformer area identification method includes: performing data acquisition on all sub-meters and a master meter in an identification domain to obtain a steady-state load, and generating a steady-state load jump curve; and performing load jump feature matching between steady-state load jump curves of all the sub-meters and a steady-state load jump curve of the master meter, and obtaining attribution of the sub-meters with a load jump according to matching results. A method for constructing transformer area line topology is further provided. A load jump identification technique is utilized to acquire a load value of each node in a transformer area power supply network, so as to form a load jump curve for each node. By performing load jump feature matching between load jump curves of all sub-meters and a load jump
(Continued)

curve of a master meter, a mounting relationship of a corresponding electric meter is determined.

8 Claims, 5 Drawing Sheets

(58) Field of Classification Search
USPC .......................................................... 702/60
See application file for complete search history.

(56) References Cited

FOREIGN PATENT DOCUMENTS

| | | |
|---|---|---|
| CN | 109344144 A | 2/2019 |
| CN | 109444800 A | 3/2019 |
| CN | 109856507 A | 6/2019 |
| CN | 110120668 A | 8/2019 |
| CN | 110707686 A | 1/2020 |
| JP | 2014187803 A | 10/2014 |

* cited by examiner

TRANSFORMER AREA IDENTIFICATION METHOD AND METHOD FOR CONSTRUCTING TRANSFORMER AREA LINE TOPOLOGY

CROSS REFERENCE TO THE RELATED APPLICATIONS

This application is the national phase entry of International Application No. PCT/CN2020/114634, filed on Sep. 11, 2020, which is based upon and claims priority to Chinese Patent Application No. 201910843965.X, filed on Sep. 6, 2019, the entire contents of which are incorporated herein by reference.

TECHNICAL FIELD

The present invention relates to the technical field of smart grids, in particular to a transformer area identification method, and the present invention also relates to a method for constructing transformer area line topology.

BACKGROUND

In a power system, a transformer area is a power supply region or area of a transformer. The transformer area is a term related to operation and management of electric power. Therefore, accurate and effective identification of the transformer area can significantly improve efficiency of electric power management.

However, in the prior transformer area identification method and the prior method for constructing transformer area line topology, transformer area identification and transformer area line topology identification are both performed based on the connection of the power supply line during power grid installation, but there may be incorrect connection of the power supply line during the power grid installation, which leads to incorrect transformer area identification and incorrect transformer area line topology identification, such that the transformer area cannot be quickly and accurately identified and the transformer area line topology cannot be quickly and accurately constructed.

At present, no effective solution is provided to solve the technical problem of poor identification accuracy in the prior transformer area identification method and the prior method for constructing transformer area line topology.

SUMMARY

The present invention provides a transformer area identification method and a method for constructing transformer area line topology, so as to solve the technical problem of poor identification accuracy in the prior transformer area identification method and the prior method for constructing transformer area line topology.

According to an aspect of the present invention, a transformer area identification method is provided, including the following steps:

step S1: performing data acquisition on all sub-meters and a master meter in an identification domain to obtain a steady-state load, and generating a steady-state load jump curve; and step S2: performing load jump feature matching between steady-state load jump curves of all the sub-meters and a steady-state load jump curve of the master meter and obtaining attribution of the sub-meters with a load jump according to matching results.

Further, the transformer area identification method may further include the following steps:

step S3: performing high-frequency data acquisition on all the sub-meters and the master meter in the identification domain to obtain load transient change features, matching load transient change features of all the sub-meters with load transient change features of the master meter, and obtaining the attribution of the sub-meters with the load jump according to matching results.

Further, a process of matching the load transient change features of all the sub-meters with the load transient change features of the master meter in step S3 may specifically include the following sub-steps:

extracting noise of the sub-meters in smooth fluctuation, superimposing the noise with the load transient change features of jumping sub-meters to calculate expected load transient change features of the master meter, then fitting and comparing the expected load transient change features of the master meter with an actual load characteristic curve of the master meter within a period of time centered on a jumping time point, and obtaining the attribution of the jumping sub-meters according to comparison results; or directly ignoring the noise of the sub-meters in smooth fluctuation, superimposing the load transient change features of the jumping sub-meters to calculate expected load transient change features of the master meter, then fitting and comparing the expected load transient change features of the master meter with the actual load characteristic curve of the master meter within the period of time centered on the jumping time point, and obtaining the attribution of the jumping sub-meters according to comparison results.

Further, the transformer area identification method may further include the following step:

step S4: performing matching and identification on the sub-meters being in a state of smooth fluctuation continuously after a specific load is artificially increased.

Further, in step S1, steady-state load data may be obtained by window reading, the load data at a plurality of time points may be obtained in one time window, and if a plurality of pieces of load data in one time window fluctuates smoothly, feature matching may be performed using a smooth value; and if a jump exists between the plurality of pieces of load data in one time window, the read load data may be discarded, and feature matching may not be performed.

The present invention further provides a method for constructing transformer area line topology, including the following steps:

step S100: setting a branch terminal at a starting point of each branch line in a transformer area to measure a total load on a subsequent power supply line starting from the branch terminal;

step S200: performing data acquisition on all branch terminals and a master meter in the transformer area to obtain a steady-state load, and generating a steady-state load jump curve;

step S300: performing load jump feature matching between a steady-state load jump curve of a branch terminal with a load jump and a steady-state load jump curve of the master meter, and if jump values of branch terminals with the load jump are equal to and in the same direction as a load jump value of the master meter, determining that the jumping branch terminals are located on the same branch line and the load jump occurs after the last jumping branch terminal on the branch line;

step S400: repeating step S300 until all branch lines of a transformer area power supply network are identified to construct transformer area branch topology;

step S500: performing data acquisition on all the branch terminals and sub-meters in the transformer area to obtain a steady-state load, and generating a steady-state load jump curve;

step S600: performing load jump feature matching between a steady-state load jump curve of a sub-meter with the load jump and steady-state load jump curves of the branch terminals, and obtaining a position of the sub-meter with the load jump according to matching results; and step S700: repeating step S600 until positions of all the sub-meters are identified to construct the transformer area line topology.

Further, step S300 may further include the following sub-steps:

when a new load jump occurs, sorting the branch terminals on the same branch line according to a position of the load jump; and/or performing sorting according to loads of different branch terminals on the same branch at the same moment.

Further, step S300 may further include the following sub-steps:

performing high-frequency data acquisition on all the branch terminals in the transformer area to obtain load transient change features, comparing the load transient change features of all the branch terminals, and if the load of some branch terminals fluctuates smoothly, and the other jumping branch terminals show similar load transient change features, determining that the jumping branch terminals are located on the same branch line and the load jump occurs after the last jumping branch terminal on the branch line; and if the jumping branch terminals show a first load transient change feature, a second load transient change feature and a third load transient change feature, and the first load transient change feature is a superposition of the second load transient change feature and the third load transient change feature, determining that a branch terminal showing the first load transient change feature and a branch terminal showing the second load transient change feature are located on the same branch line, the branch terminal showing the first load transient change feature and a branch terminal showing the third load transient change feature are located on the same branch line, and the branch terminal showing the first load transient change feature is located before the branch terminal showing the second load transient change feature and the branch terminal showing the third load transient change feature in the branch line.

Further, step S600 may specifically include the following sub-steps:

if one sub-meter in the transformer area has the load jump, and the remaining sub-meters are in smooth load fluctuation, determining that the jumping sub-meter is located on the branch line with the load jump, and is located after the last jumping branch terminal on the branch line;

if two sub-meters in the transformer area have reverse load jumps, directly matching single load jump features of the two sub-meters one by one to find the position of each jumping sub-meter, and determining that two jumps occur on two branches; if the position of any one of the sub-meters is incapable of being found, determining that the two sub-meters are at the same point on the same branch, and at this time, if a difference between the two jumps is large, calculating a combined jump value of the two jumps, and then processing the combined jump value according to a single jump to find a position of a combined jump in the branch topology, where the position of the combined jump may be a common position of the two jumping sub-meters; and if only one sub-meter is capable of being found, determining that the two sub-meters are located after different branch terminals of the same branch, and the other sub-meter is located before the first branch terminal with the load jump value changing greatly compared with a previous branch terminal on the branch; and if two sub-meters in the transformer area have load jumps in the same direction, and the jump values are quite different, first calculating a combined jump value of the jumps, then processing the combined jump value according to the single jump to find a position of the combined jump in the branch topology, and then matching single load jump features of the two sub-meters one by one from this position to find the position of each jumping sub-meter; if the position of any one of the sub-meters is incapable of being found, determining that the two sub-meters are at the same point on the same branch, and the position of the combined jump is a common position of the two jumping sub-meters; and if the position of only one sub-meter is capable of being found, determining that the position of the other sub-meter is the position of the combined jump.

Further, step S600 may further include the following sub-steps:

performing high-frequency data acquisition on all the sub-meters and the branch terminals in the transformer area to obtain load transient change features, matching load transient change features of all the sub-meters with load transient change features of all the branch terminals, and if one sub-meter shows the load transient change features, and load of the remaining sub-meters fluctuates smoothly, determining that the jumping sub-meter is located on the branch showing the same load transient change features, and is located after the last jumping branch terminal on the branch; and if two sub-meters show the load transient change features, and load of the remaining sub-meters fluctuates smoothly, first calculating combined load transient change features of the two jumping sub-meters, then processing the combined load transient change features according to the single jump to find the branch terminal corresponding to the combined load transient change features in the branch topology, and continuing to match the respective load transient change features of each jumping sub-meter from the branch terminal, so as to find the position of each jumping sub-meter.

The present invention has the following beneficial effects.

According to the transformer area identification method of the present invention, a load jump identification technique is utilized, a steady-state load of each node in a transformer area power supply network is acquired, load jump feature matching is performed between steady-state load jump curves of all sub-meters and a steady-state load jump curve of a master meter, and, on the basis of the identification of the load jump features, a mounting relationship of a corresponding electric meter is determined. Thus, the effect of line loss power may be eliminated and identification accuracy is increased.

In addition, by introducing the branch terminals into the transformer area power supply network to measure the total load on each branch, the method for constructing transformer area line topology of the present invention can quickly and accurately construct the transformer area branch topology and line topology combined with the load jump identification technique of the steady-state load.

The present invention may have other objectives, features and advantages than the objective, features and advantages as described above. The present invention will be further described below in detail with reference to accompanying drawings.

BRIEF DESCRIPTION OF THE DRAWINGS

The accompanying drawings constituting a part of the present invention provide further understanding of the present invention. Schematic embodiments of the present invention and description thereof are intended to illustrate the present invention and do not constitute an undue limitation on the present invention. In the drawings.

DETAILED DESCRIPTION OF THE EMBODIMENTS

The detailed description of the embodiments of the present invention is given below with reference to the accompanying drawings, but the present invention can be implemented in a plurality of different modes limited and involved in the following.

Figure 1:
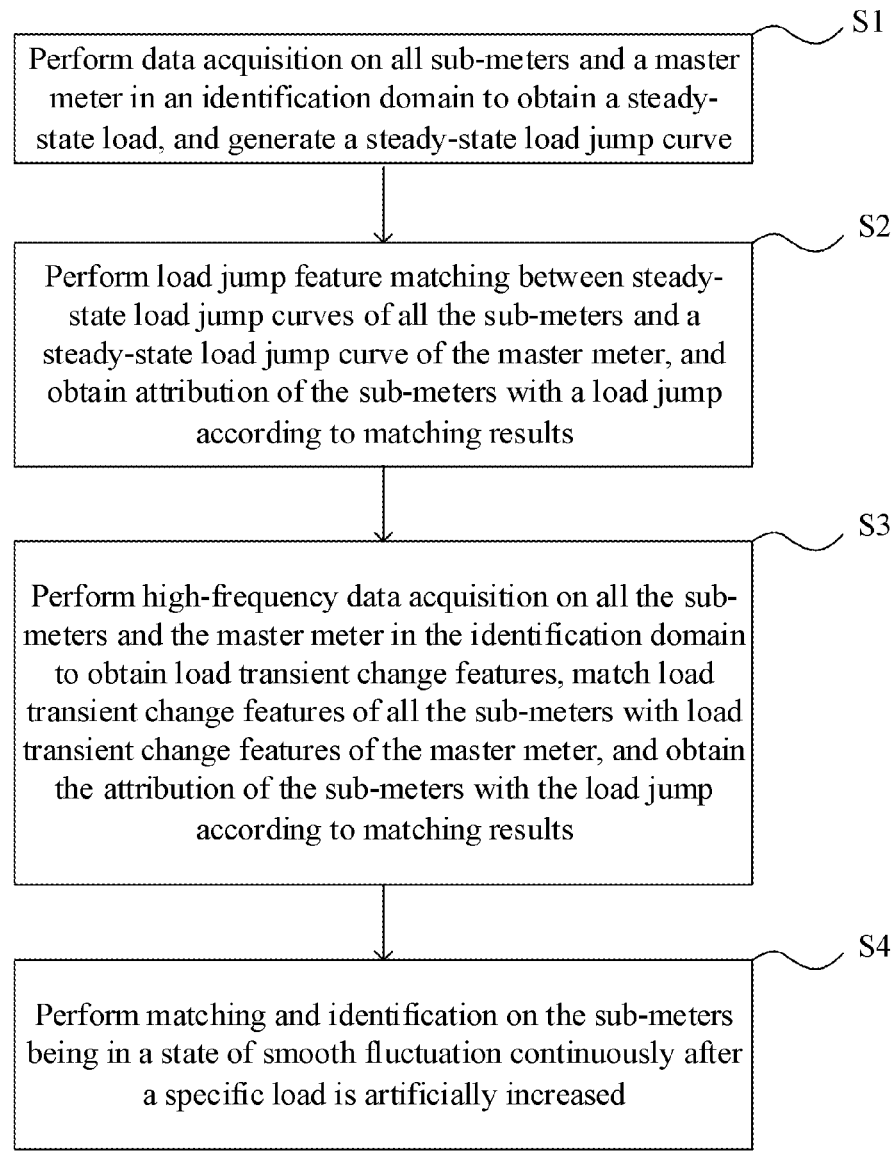
FIG. 1 is a schematic flowchart of a transformer area identification method according to a first embodiment of the present invention.

As shown in FIG. 1, a first embodiment of the present invention provides a transformer area identification method, performs identification of a transformer area power supply network based on a load jump identification technique, and includes the following steps:

Step S1: data acquisition is performed on all sub-meters and a master meter in an identification domain to obtain a steady-state load, and a steady-state load jump curve is generated.

Step S2: load jump feature matching is performed between steady-state load jump curves of all the sub-meters and a steady-state load jump curve of the master meter, and attribution of the sub-meters with a load jump is obtained according to matching results.

The load jump is digital abstraction of load change, which can abstract a continuous load change into two states of 0 (smooth fluctuation) and 1 (load jump), such that the continuously changing load characteristic curve can be converted into a digital load jump curve. It can be understood that in step S1, the load can be the basic load parameters of the power system such as apparent power, active power, reactive power, power factor, current, active current, and reactive current, and the change features of these load parameters over time can be used to determine the type and attribution of the load, which can be well applied to the identification of the transformer area power supply network. In addition, in step S1, low-frequency data acquisition can be performed to obtain the steady-state load and high-frequency data acquisition can be performed to obtain the steady-state load, which can be selected according to actual needs. In addition, time synchronization needs to be ensured when data acquisition is performed in step S1 to ensure the reliability of the acquired data and facilitate subsequent load jump identification. The time synchronization includes acquisition time synchronization and measurement time synchronization. Acquisition time synchronization means that the entire transformer area power supply network initiates load reading commands for different electric meters at the same moment. Measurement time synchronization means that the electric meters perform load measurement at the same moment after receiving the reading commands. High-precision time synchronization can ensure the time synchronization of the load statistics of all equipment in the transformer area power supply network, which is the basis of the load jump identification technique. In the present embodiment, both the master meter and the sub-meters of the transformer area power supply network use carrier modules to form a carrier network together. The broadband carrier network has high-precision time synchronization, that is, all carrier modules in the carrier network maintain high-precision synchronization according to the network reference time, such that the network reference time is used as a time system, and the load reading command is initiated on the carrier module at the same moment to achieve the synchronization of the system acquisition time. For the measurement time synchronization, the measurement and readout of the load in the electric meter are realized by the measurement core and the management core respectively. The measurement core is responsible for periodically measuring and recording load data and the management core is responsible for reading the load data. There is a random time difference between the time point of measuring the load and the time point of reading the load, which is between 0 and several hundred milliseconds. This natural time difference makes it difficult to accurately synchronize the measurement time, which is difficult to fundamentally solve, but the adverse effects can be eliminated by the subsequent means of the present embodiment.

It can be understood that in step S1, the steady-state load is obtained by means of single-point reading or window reading. Single-point reading refers to reading according to a time point and, as a result, a reading data is obtained. However, the single-point reading method cannot eliminate the influence caused by the asynchronous measurement time, resulting in errors in the recognition results. Therefore, in the present embodiment, the steady-state load is preferably obtained by window reading. Specifically, the steady-state load is read according to a time window. A time window includes a plurality of time points and the reading data of a plurality of time points can be obtained by reading in one time window. If a plurality of pieces of load data read in a time window fluctuates smoothly, it can be considered that the load of the electric meter is in a steady state at the reading node; subsequently, the smooth value can be used for feature matching. The smooth value can be the load data at a certain time point in the window or the average value of a plurality of pieces of load data in the window. If a jump exists in the plurality of pieces of load data read in a time window, it is considered that the load of the electric meter is not in a steady state at the reading node. Thereafter, the load data read in this time window is discarded and subsequent load jump feature matching is not performed. For example, if the acquisition cycle is one minute, then the load data is read once in one minute and the data is read by the window. If the window is three seconds, and the data is read once per second, then three load data can be read in each reading cycle with an interval of one second. If the three data of this reading cycle fluctuates smoothly, it can be considered that the load of the electric meter is in a steady state at this node and the average value of the load data can be used for subsequent feature matching. However, if there is a jump in the three load data of this reading cycle, it is considered that the load of the electric meter is not in a steady state at this node and is discarded. Thereafter, the steady-state load jump identification is not performed in this cycle. It can be understood that when a reading window contains only one reading, it corresponds to the mode of single-point reading.

In the present embodiment, the steady-state load is obtained by using the window reading method and performing data smoothing and the non-steady-state data is directly discarded, thereby effectively eliminating the influence caused by the asynchronous measurement time and ensuring the accuracy and reliability of the identification results of the transformer area.

It can be understood that step S2 is specifically as follows: when at a certain acquisition time point, the load of only one sub-meter jumps, that is, the load changes to 1, and the loads of the remaining sub-meters fluctuate smoothly, that is, the load change is 0, then the load jump feature of this sub-meter is the single load jump feature of the transformer area. The steady-state load jump curve of the jumping sub-meter is matched with the steady-state load jump curve of the master meter. If the jumping sub-meter and the master meter show corresponding load jump features, and the jump values are equal, then the jumping sub-meter belongs to the master meter. If the jumping sub-meter and the master meter do not show corresponding load jumping features, or the jumping values are far different, the jumping sub-meter does not belong to the master meter. In addition, the single load jump feature can also derive a more complex combined jump feature, and the combined jump feature can be matched with the load jump presented by the master meter to determine the attribution of all jumping sub-meters. For example, when the loads of a plurality of sub-meters jump in the same direction at a certain acquisition time point, and the loads of the remaining sub-meters fluctuate smoothly, the load jumps of the sub-meters constitute a combined jump feature. If the master meter shows corresponding load jump features, and the jump values are equal, the jumping sub-meters belong to the master meter.

According to the transformer area identification method of the present embodiment, the load jump identification technique is utilized, a steady-state load of each node in a transformer area power supply network is acquired, load jump feature matching is performed between steady-state load jump curves of all sub-meters and a steady-state load jump curve of a master meter, and, on the basis of the identification of the load jump features, a mounting relationship of a corresponding electric meter is determined. Thus, the effect of line loss power may be eliminated and identification accuracy is increased.

It can be understood that, preferably, the transformer area identification method further includes the following steps:

Step S3: high-frequency data acquisition is performed on all the sub-meters and the master meter in the identification domain to obtain load transient change features, the load transient change features of all the sub-meters are matched with the load transient change features of the master meter, and the attribution of the sub-meters with the load jump is obtained according to matching results.

It can be understood that a process of matching the load transient change features of all the sub-meters with the load transient change features of the master meter in step S3 specifically includes the following sub-steps:

Noise of the sub-meters in smooth fluctuation is extracted, the noise is superimposed with the load transient change features of the jumping sub-meters to calculate expected load transient change features of the master meter, then the expected load transient change features of the master meter are fit and compared with an actual load characteristic curve of the master meter within a period of time centered on a jumping time point, and the attribution of the jumping sub-meters is obtained according to comparison results. In particular, when the noise is reduced to zero, the noise of the sub-meters in smooth fluctuation is directly ignored, the load transient change features of the jumping sub-meters are superimposed to calculate the expected load transient change features of the master meter, then the expected load transient change features of the master meter are fit and compared with an actual load characteristic curve of the master meter within a period of time centered on a jumping time point, and the attribution of the jumping sub-meters is obtained according to comparison results.

When a single load jump occurs, the load of the jumping sub-meter shows its unique load transient change features, and other electric meters fluctuate smoothly. At this time, the load of the master meter should show the superposition of the load transient change features of the jumping sub-meter and the noise of the remaining sub-meters in smooth fluctuation. By extracting the noise and superimposing it with the load transient change features of the jumping sub-meter, the expected load transient change features of the master meter can be calculated, and then the expected load transient change features of the master meter can be fit and compared with the actual load characteristic curve of the master meter within a period of time centered on a jumping time point. If the expected load transient change features of the master meter are fit with the actual load characteristic curve of the master meter, it is determined that the jumping sub-meter belongs to the master meter. Otherwise, the jumping sub-meter does not belong to the master meter. When a combined load jump occurs, the combined load transient change features can be used for identification first and then the transient characteristics of a single load jump can be used for identification respectively. For example, when two sub-meters have load jumps and have different load transient change features, the remaining sub-meters fluctuate smoothly. At this time, the load transient change features of the two sub-meters are first superimposed. If the load transient change features of the master meter match the superimposed load transient change features of the sub-meters, then the two sub-meters belong to the master meter. If they do not match, then the load transient change features of each sub-meter will be compared with the load transient change features of the master meter. If the matching is successful, then the sub-meter belongs to the master meter.

The noise of the sub-meter in smooth fluctuation is extracted by the following steps:

The average value of the load of the master meter in smooth fluctuation within a period of time before and after the jump is taken as the noise.

It can be understood that the execution sequence of step S3 and step S1 are in no particular order and that step S1 and step S3 may be performed simultaneously or sequentially.

In the present embodiment, the load transient change features of all the sub-meters and the master meter are acquired through high-frequency data and then the combined state features of the jumping sub-meters and the noise are superimposed to calculate the expected load transient change features of the master meter. Finally, the calculated expected load transient change features of the master meter are fit and compared with the actual load characteristic curve of the master meter within a period of time centered on a jumping time point, which can also effectively eliminate the influence caused by the asynchronous measurement time. The high-frequency data is used to acquire the load transient characteristics (that is, the load transient change features), and through combination with the steady-state characteristics of data acquisition in step S1 (that is, the steady-state load), the identification speed and accuracy are greatly improved, and the identification cycle is shortened.

It can be understood that preferably, the transformer area identification method further includes the following steps:

Step S4: matching and identification are performed on the sub-meters being in a state of smooth fluctuation continuously after a specific load is artificially increased.

If the load of some sub-meters in the transformer area is always in a smooth fluctuation state, that is, there is no load jump, and when the load jump identification technique cannot be used for identification in a short time, a specific load can be artificially added to the transformer area power supply network, such as the on-off of thyristor-controlled capacitors. By matching this specific load, those sub-meters that are in the state of smooth fluctuation continuously can be quickly identified, which improves the identification speed of the transformer area and ensures the integrity of identification of the entire transformer area power supply network.

Figure 2:
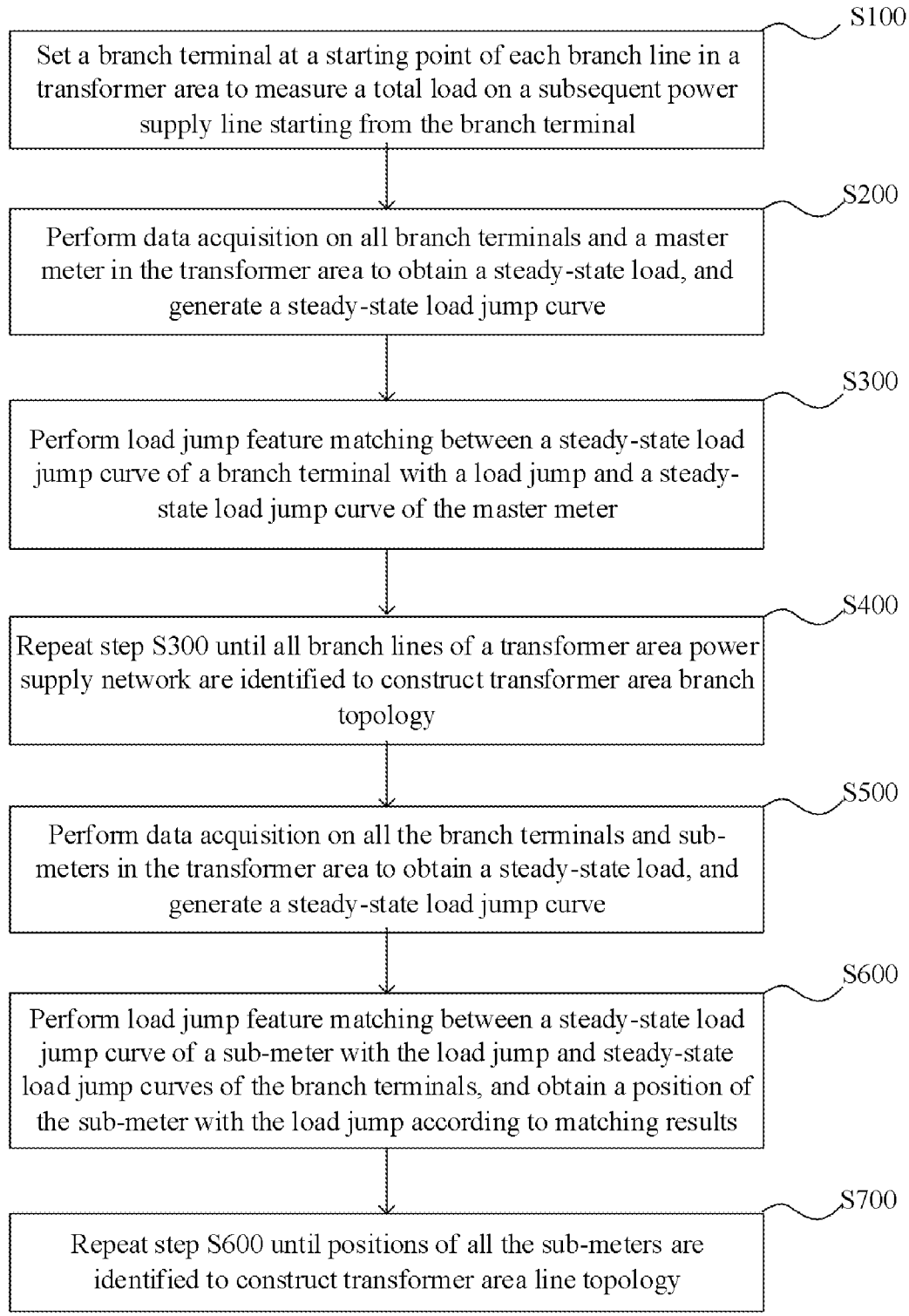
FIG. 2 is a schematic flowchart of a method for constructing transformer area line topology according to a second embodiment of the present invention.

It can be understood that, as shown in FIG. 2, a second embodiment of the present invention further provides a method for constructing transformer area line topology, which can construct transformer area line topology on the basis of an existing transformer area, or construct transformer area line topology on the basis of steady-state jump identification and transient jump identification described in the first embodiment. The method for constructing transformer area line topology includes the following steps:

Step S100: a branch terminal is set at a starting point of each branch line in a transformer area to measure a total load on a subsequent power supply line starting from the branch terminal.

Step S200: data acquisition is performed on all branch terminals and a master meter in the transformer area to obtain a steady-state load and a steady-state load jump curve is generated.

Step S300: load jump feature matching is performed between a steady-state load jump curve of a branch terminal with a load jump and a steady-state load jump curve of the master meter, and if jump values of branch terminals with the load jump are equal to and in the same direction as a load jump value of the master meter, the jumping branch terminals are located on the same branch line and the load jump occurs after the last jumping branch terminal on the branch line.

Step S400: step S300 is repeated until all branch lines of a transformer area power supply network are identified to construct transformer area branch topology.

Step S500: data acquisition is performed on all the branch terminals and sub-meters in the transformer area to obtain a steady-state load and a steady-state load jump curve is generated.

Step S600: load jump feature matching is performed between a steady-state load jump curve of a sub-meter with the load jump and steady-state load jump curves of the branch terminals and a position of the sub-meter with the load jump is obtained according to matching results.

Step S700: step S600 is repeated until positions of all the sub-meters are identified to construct the transformer area line topology.

Figure 3:
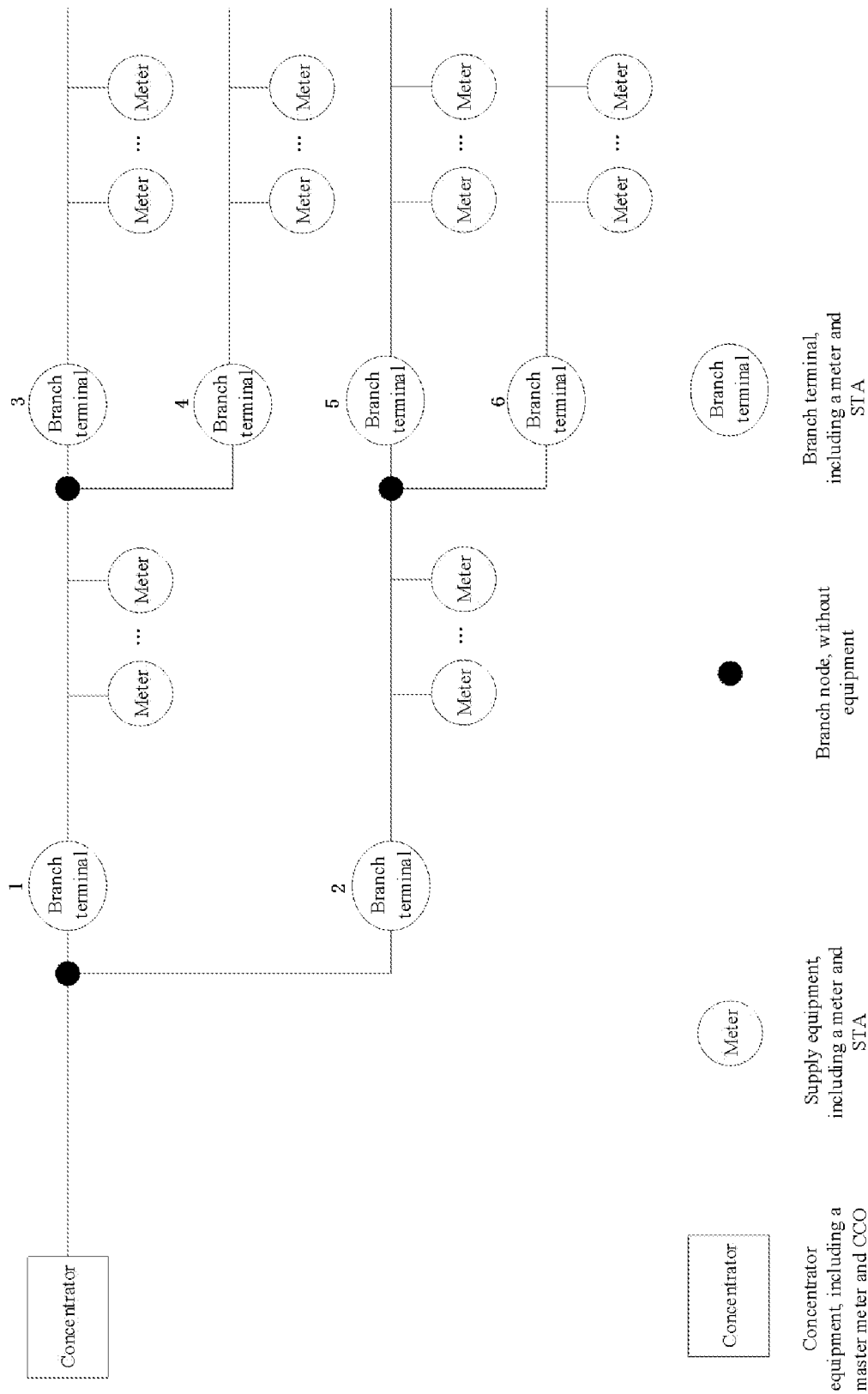
FIG. 3 is a schematic diagram of setting a branch terminal in step S100 in FIG. 2 according to the second embodiment of the present invention.

It can be understood that as shown in FIG. 3, in step S100, the branch terminal refers to the branch equipment installed at the starting point of each branch line, which can measure the entire branch line, that is, the total load on the subsequent power supply line starting from the branch terminal is measured. The branch terminal may be an intelligent low-voltage branch monitoring unit, or other branch equipment with a load metering function. The branch terminal communicates through the carrier module and forms a carrier communication network together with the central coordination organization (CCO) of the concentrator and the station (STA, that is, the carrier module) of the sub-meter. The concentrator equipment includes the master meter and the CCO, the branch terminal includes the electric meter and the carrier module, and the sub-meter includes the electric meter and the carrier module.

The data acquisition method in step S200 is the same as that in step S1 in the first embodiment, so it is not repeated here.

Figure 4:
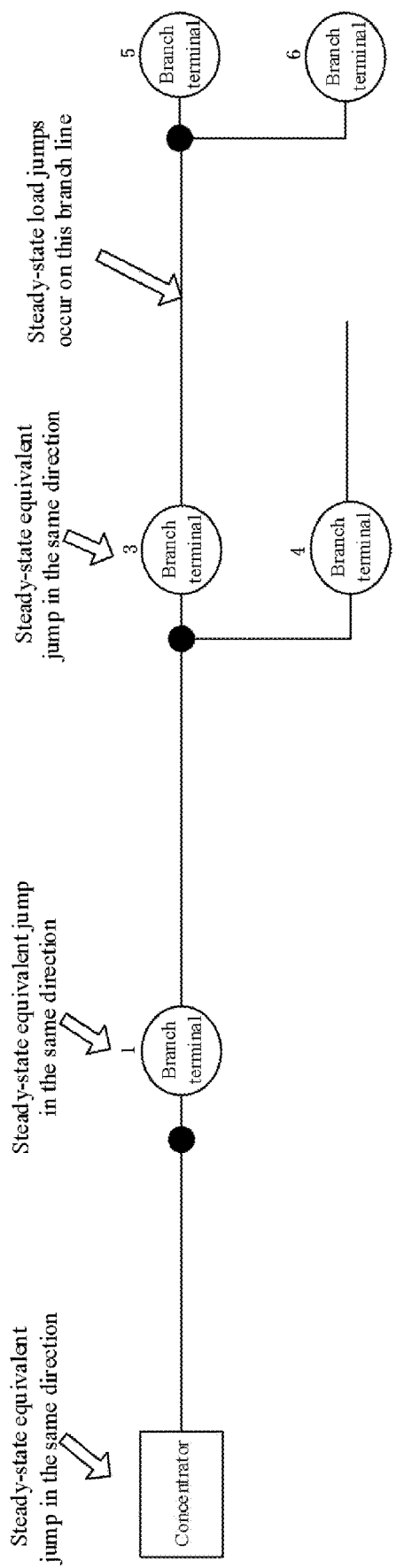
FIG. 4 is a schematic diagram of branch topology for load jump feature matching in step S300 in FIG. 2 according to the second embodiment of the present invention.

In step S300, when the load of some branch terminals fluctuates smoothly, the load of other branch terminals jumps and the jump value is equal to and in the same direction as the load jump value of the master meter of the concentrator. The load jump is concentrated between two adjacent branch terminals in the same branch or after the last branch terminal in the branch and it is determined that the jumping branch terminals are located on the same branch line and the load jump occurs after the last jumping branch terminal on the branch line. For example, as shown in FIG. 4, when a steady-state equivalent jump in the same direction occurs in the master meter of the concentrator, a branch terminal 1, and a branch terminal 3, it can be determined that the concentrator, the branch terminal 1, and the branch terminal 3 are located on the same branch line and the load jump occurs on the branch line after the branch terminal 3.

It can be understood that step S300 further includes the following sub-steps:

When a new load jump occurs, the branch terminals on the same branch line are sorted according to a position of the load jump; and/or sorting is performed according to loads of different branch terminals on the same branch at the same moment.

When a new load jump occurs, the branch terminals on the same branch line can be sorted according to a position of the load jump. For example, as shown in FIG. 4, when an equivalent load jump in the same direction occurs in the concentrator, the branch terminal 1, and the branch terminal 3, but no load jump occurs at a branch terminal 5, it can be determined that the branch terminal 5 is located after the branch terminal 1 and the branch terminal 3 in the branch. When an equivalent load jump in the same direction occurs in the concentrator and the branch terminal 1, but no load jump occurs at the branch terminal 3 and the branch terminal 5, it can be determined that branch terminal 3 and the branch terminal 5 are located after the branch terminal 1 in the branch, so it can be concluded that the order of this branch is the branch terminal 1, the branch terminal 3, and the branch terminal 5. Alternatively, the loads of different branch terminals on the same branch at the same moment can also be used as the basis for sorting. For example, on the same branch, when the load of the branch terminal 1 is significantly greater than the load of the branch terminal 3, it is determined that the branch terminal 1 is located before the branch terminal 3.

It can be understood that, preferably, step S300 further includes the following sub-steps:

High-frequency data acquisition is performed on all the branch terminals in the transformer area to obtain load transient change features, the load transient change features of all the branch terminals are compared, and if the load of some branch terminals fluctuates smoothly, and the other jumping branch terminals show similar load transient change features, the jumping branch terminals are located on the same branch line and the load jump occurs after the last jumping branch terminal on the branch line.

If the jumping branch terminals show a first load transient change feature, a second load transient change feature, and a third load transient change feature, and the first load transient change feature is a superposition of the second load transient change feature and the third load transient change feature, a branch terminal showing the first load transient change feature and a branch terminal showing the second load transient change feature are located on the same branch line, the branch terminal showing the first load transient change feature and a branch terminal showing the third load transient change feature are located on the same branch line, and the branch terminal showing the first load transient change feature is located before the branch terminal showing the second load transient change feature and the branch terminal showing the third load transient change feature in the branch line.

In the present embodiment, by combining the obtaining of the load transient change features through high-frequency data acquisition with the obtaining of the steady-state load through data acquisition, the construction speed and identification accuracy of the branch topology can be greatly improved.

The above step S300 is repeated until the branch line attribution of all branch terminals is determined, so as to complete the identification of each branch line of the transformer area power supply line, for example, a branch line 1 (the branch terminals 1, 3, and 5) in FIG. 4, a branch line 2 (branch terminals 1 and 4), and a branch line 3 (branch terminals 1, 3, and 6). So far, the branch topology identification of the transformer area power supply network is completed.

It can be understood that step S500 is roughly the same as step S300, and the only difference is that the data acquisition objects are different. Step S300 acquires the steady-state load of the branch terminal and the master meter of the concentrator, while step S500 acquires the steady-state load of the branch terminal and the sub-meter.

It can be understood that, preferably, step S500 further includes the following sub-steps:

Matching and identification are performed on the sub-meters being in a state of smooth fluctuation continuously after a specific load is artificially increased.

If the load of some sub-meters in the transformer area is always in a smooth fluctuation state, that is, there is no load jump, and when the load jump identification technique cannot be used for identification in a short time, a specific load can be artificially added to the transformer area power supply network, such as the on-off of thyristor controlled capacitors, and by matching this specific load, those sub-meters that are in the state of smooth fluctuation continuously can be quickly identified, which improves the construction speed of the transformer area line topology and ensures the integrity of the entire transformer area line topology.

It can be understood that on the basis of constructing the branch topology in the previous steps, the attribution of the sub-meter corresponding to the branch terminal is further identified to complete the identification of the line topology. Step S600 specifically includes the following sub-steps:

If one sub-meter in the transformer area has the load jump and the remaining sub-meters are in smooth load fluctuation, then there should be the load jump on the branch terminal on a branch line, the jumping sub-meter is located on the branch line with the load jump, and is located after the last jumping branch terminal on the branch line.

Figure 5:
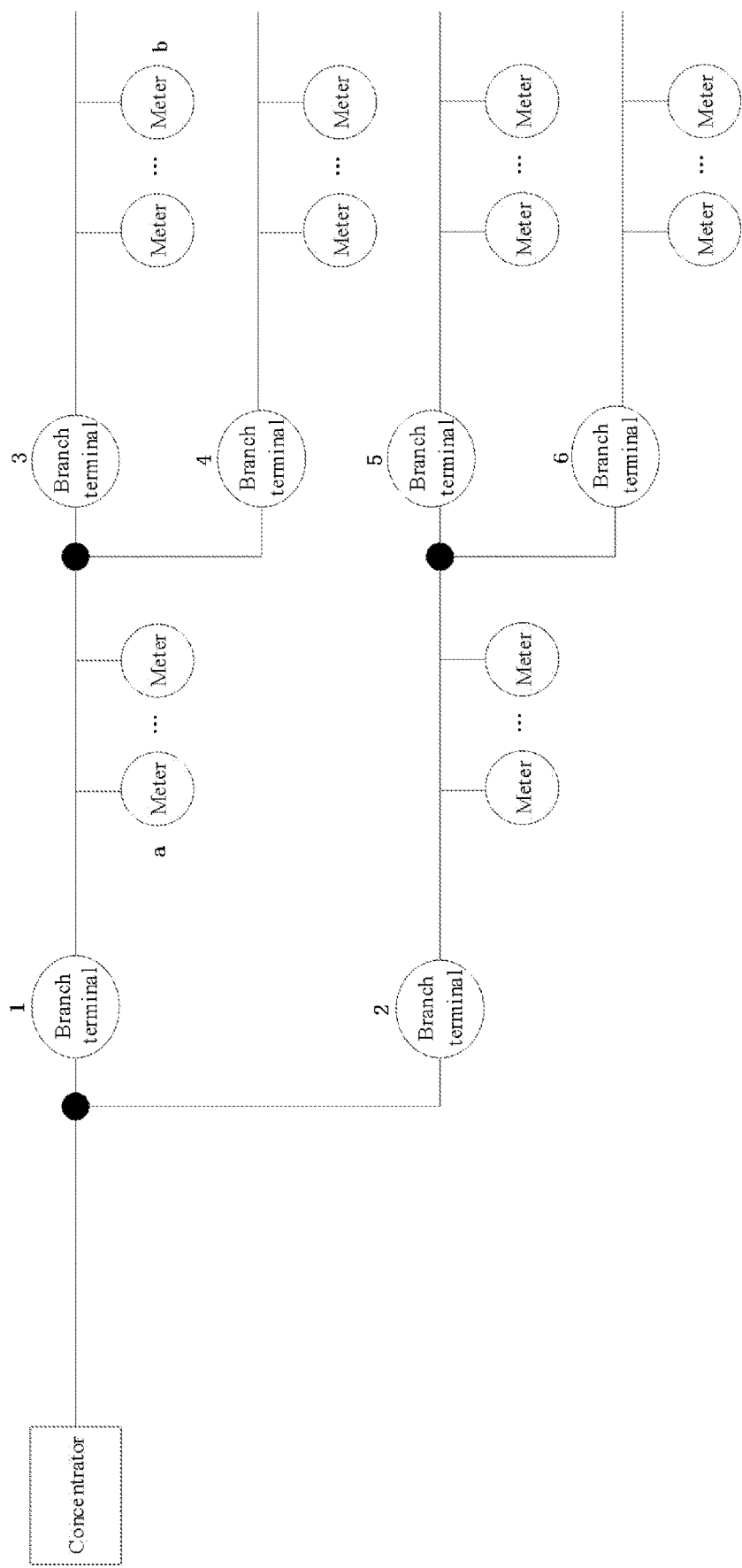
FIG. 5 is a schematic diagram of line topology for load jump feature matching when two sub-meters have load jumps in step S600 in FIG. 2 according to the second embodiment of the present invention.

If two sub-meters in the transformer area have reverse load jumps, single load jump features of the two sub-meters are directly matched one by one to find the position of each jumping sub-meter, and, in this case, the two jumps occur on two branches. If the position of any one of the sub-meters is incapable of being found, in this case, the two sub-meters are at the same point on the same branch, and, at this time, if a difference between the two jumps is large, a combined jump value of the two jumps is calculated and then processed according to a single jump to find a position of a combined jump in the branch topology. The position of the combined jump is a common position of the two jumping sub-meters. If only one sub-meter is capable of being found, in this case, the two sub-meters are located after different branch terminals of the same branch, and the other sub-meter is located before the first branch terminal with the load jump value changing greatly compared with a previous branch terminal on the branch. As shown in FIG. 5, if a sub-meter a and a sub-meter b have reverse load jumps, the single load jump features of the two sub-meters are matched one by one, and the branch terminal 3 and the sub-meter b are matched successfully, then it is determined that the sub-meter b is after the branch terminal 3. However, the position of the sub-meter a cannot be directly determined according to the jump features of the sub-meter a. This scenario is consistent with the third case mentioned above, while the load jump value between the branch terminal 3 and the branch terminal 1 has changed significantly, so it can be concluded that the sub-meter a is located before the branch terminal 3 and after the branch terminal 1.

If two sub-meters in the transformer area have load jumps in the same direction, and the jump values are quite different, a combined jump value of the jumps is first calculated, and then processed according to the single jump to find a position of the combined jump in the branch topology, and then single load jump features of the two sub-meters are matched one by one from this position to find the position of each jumping sub-meter. If the position of any one of the sub-meters is incapable of being found, it is indicated that the two sub-meters are at the same point on the same branch, and the position of the combined jump is a common position of the two jumping sub-meters. If the position of only one sub-meter is capable of being found, the position of the other sub-meter is the position of the combined jump.

In the above processing method, the discrete jumps are combined, and the combined jump and each discrete jump are matched with each branch terminal at an appropriate time to determine the position of the jump. Obviously, the processing methods for the reverse jumps of two sub-meters and the jumps of two sub-meters in the same direction are interchangeable. Likewise, this processing method can also be applied to the case of a plurality of jumps.

It can be understood that preferably, step S600 further includes the following sub-steps:

High-frequency data acquisition is performed on all the sub-meters and the branch terminals in the transformer area to obtain load transient change features, the load transient change features of all the sub-meters are matched with the load transient change features of all the branch terminals, and if one sub-meter shows the load transient change features, and load of the remaining sub-meters fluctuates smoothly, the jumping sub-meter is located on the branch showing the same load transient change features, and is located after the last jumping branch terminal on the branch. If two sub-meters show the load transient change features, and load of the remaining sub-meters fluctuates smoothly, combined load transient change features of the two jumping sub-meters are first calculated, and then processed according to the single jump to find the branch terminal corresponding to the combined load transient change features in the branch topology, and the respective load transient change features of each jumping sub-meter are matched continuously from the branch terminal, so as to find the position of each jumping sub-meter.

Step S600 is repeated until the positions of all the sub-meters in the corresponding branch lines are identified to construct the transformer area line topology.

According to the method for constructing transformer area line topology in the present embodiment, the total load on each branch is measured by introducing the branch terminals into the transformer area power supply network, which can be combined with the load jump identification technique of the steady-state load to quickly and accurately construct the transformer area branch topology and line topology, and can also be combined with the load jump identification technique of the load transient change features to construct the branch topology and the line topology. The steady-state load jump identification technique can effectively eliminate the influence caused by the asynchronous measurement time by acquiring steady-state data by means of window reading and smoothing the data, and directly discarding the non-steady-state data. The transient load jump identification technique fits and compares the calculated load characteristics of the master meter with the actual load characteristic curve of the master meter within a period of time centered on a jumping time point, which can also effectively eliminate the influence caused by the asynchronous measurement time. In addition, the steady-state technique and transient technique can be combined to greatly improve the construction speed and accuracy of the transformer area line topology.

It can be understood that preferably, the acquisition time synchronization and the measurement time synchronization of the transformer area power supply network are relied on, and the influence of the asynchronous measurement time is eliminated by reading the steady-state data by means of window reading and smoothing the data. Any one of line loss power, average current, wire resistance, and wire length of the transformer area power supply network can be calculated based on the synchronized steady-state load data, so as to realize the dynamic monitoring of the cable aging of the entire line and the rapid positioning and troubleshooting of line faults.

In the present embodiment, based on the time synchronization of the carrier network, the influence of the asynchronous measurement time is eliminated by reading the steady-state data by means of window reading and smoothing the data, such that the synchronized steady-state load data can be obtained, and any one of line loss power, average current, wire resistance, and wire length of the transformer area power supply network can be further calculated, so as to perform network-wide monitoring on the transformer area line topology, and realize the dynamic monitoring of the cable aging of the entire line and the rapid positioning and troubleshooting of line faults.

The above description is merely preferred embodiments of the present invention and is not intended to limit the present invention, and various changes and modifications of the present invention may be made by those skilled in the art. Any modifications, equivalent substitutions, improvements, and the like made within the spirit and principle of the present invention should be included within the protection scope of the present invention.

What is claimed is:

1. A transformer area identification method of power supply lines in a transformer area for quickly and accurately identifying transformer area power supply line topology to dynamically monitor aging of power supply lines in the transformer area and rapid positioning and troubleshooting of faults in power supply lines of the transformer area, comprising the following steps:

in the transformer area comprising a concentrator connected to a plurality of branch terminals and a plurality of branch power supply lines, each of the plurality of branch power supply lines connected at a starting point of each of the plurality of branch terminals, the concentrator comprises a master meter and central coordination organization and each of the plurality of branch terminals comprises a sub-meter, and each sub-meter comprises an electric meter and a carrier module through which each of the plurality of branch terminals communicates with the central coordination organization of the concentrator, step S1: performing data acquisition on all sub-meters and the master meter in an identification domain to obtain a steady-state load and generating a steady-state load jump curve;

step S2: performing load jump feature matching between steady-state load jump curves of all the sub-meters and a steady-state load jump curve of the master meter to obtain first matching results, and obtaining attribution of the sub-meters with a load jump according to the first matching results; and step S3: performing high-frequency data acquisition on all the sub-meters and the master meter in the identification domain to obtain load transient change features, matching load transient change features of all the sub-meters with load transient change features of the master meter to obtain second matching results, and obtaining the attribution of the sub-meters with the load jump according to the second matching results, wherein a process of matching the load transient change features of all the sub-meters with the load transient change features of the master meter in step S3 specifically comprises the following sub-steps;

extracting noise of the sub-meters in smooth fluctuation, superimposing the noise with the load transient change features of jumping sub-meters to calculate first expected load transient change features of the master meter, then fitting and comparing the first expected load transient change features of the master meter with an actual load characteristic curve of the master meter within a period of time centered on a jumping time point to obtain first comparison results, and obtaining the attribution of the jumping sub-meters according to the first comparison results; or directly ignoring the noise of the sub-meters in smooth fluctuation, superimposing the load transient change features of the jumping sub-meters to calculate second expected load transient change features of the master meter, then fitting and comparing the second expected load transient change features of the master meter with the actual load characteristic curve of the master meter within the period of time centered on the jumping time point to obtain second comparison results, and obtaining the attribution of the jumping sub-meters according to the second comparison results.

2. The transformer area identification method according to claim 1, further comprising the following step:
   step S4: performing matching and identification on the sub-meters being in a state of smooth fluctuation continuously after a specific load is artificially increased.

3. The transformer area identification method according to claim 1, wherein
   in step S1, steady-state load data is obtained by window reading, the load data at a plurality of time points is obtained in one time window, and when a plurality of pieces of load data in one time window fluctuates smoothly, feature matching is performed using a smooth value; and when a jump exists between the plurality of pieces of load data in one time window, the read load data is discarded, and feature matching is not performed.

4. A method for constructing transformer area line topology of power supply lines in a transformer area for quickly and accurately identifying transformer area power supply line topology to dynamically monitor aging of power supply lines in the transformer area and rapid positioning and troubleshooting of faults in power supply lines of the transformer area, comprising the following steps:
   in the transformer area comprising a concentrator connected to a plurality of branch terminals and a plurality of branch power supply lines, each of the plurality of branch power supply lines connected at a starting point of each of the plurality of branch terminals,
   the concentrator comprises a master meter and central coordination organization and
   each of the plurality of branch terminals comprises a sub-meter, and
   each sub-meter comprises an electric meter and a carrier module through which each of the plurality of branch terminals communicates with the central coordination organization of the concentrating,
   step S100: setting a branch terminal of the plurality of branch terminals in the transformer area to measure a total load on the power supply line starting from the branch terminal;
   step S200: performing data acquisition on all branch terminals and the master meter in the transformer area to obtain a steady-state load and generating a steady-state load jump curve;
   step S300: performing load jump feature matching between a steady-state load jump curve of a branch terminal with a load jump and a steady-state load jump curve of the master meter, and when jump values of branch terminals with the load jump are equal to and in a same direction as a load jump value of the master meter, determining that the jumping branch terminals are located on a same branch line and the load jump occurs after a last jumping branch terminal on the branch line;
   step S400: repeating step S300 until all branch lines of a transformer area power supply network are identified to construct transformer area branch topology;
   step S500: performing data acquisition on all the branch terminals and sub-meters in the transformer area to obtain a steady-state load and generating a steady-state load jump curve;
   step S600: performing load jump feature matching between a steady-state load jump curve of a sub-meter with the load jump and steady-state load jump curves of the branch terminals and obtaining a position of the sub-meter with the load jump according to matching results, and
   step S700: repeating step S600 until positions of all the sub-meters are identified to construct the transformer area line topology.

5. The method for constructing the transformer area line topology according to claim 4, wherein
   step S300 further comprises the following sub-steps:
   when a new load jump occurs, sorting the branch terminals on the same branch line according to a position of the load jump; and/or
   performing sorting according to loads of different branch terminals on a same branch at a same moment.

6. The method for constructing the transformer area line topology according to claim 5, wherein
   step S300 further comprises the following sub-steps:
   performing high-frequency data acquisition on all the branch terminals in the transformer area to obtain load transient change features, comparing the load transient change features of all the branch terminals, and when load of some branch terminals fluctuates smoothly, and the other jumping branch terminals show similar load transient change features, determining that the jumping branch terminals are located on the same branch line and the load jump occurs after the last jumping branch terminal on the branch line; and
   when the jumping branch terminals show a first load transient change feature, a second load transient change feature and a third load transient change feature, and the first load transient change feature is a superposition of the second load transient change feature and the third load transient change feature, determining that a branch terminal showing the first load transient change feature and a branch terminal showing the second load transient change feature are located on the same branch line, the branch terminal showing the first load transient change feature and a branch terminal showing the third load transient change feature are located on the same branch line, and the branch terminal showing the first load transient change feature is located before the branch terminal showing the second load transient change feature and the branch terminal showing the third load transient change feature in the branch line.

7. The method for constructing the transformer area line topology according to claim 5, wherein
   step S600 specifically comprises the following sub-steps:
   when one sub-meter in the transformer area has the load jump, and the remaining sub-meters are in smooth load fluctuation, determining that the jumping sub-meter is located on the branch line with the load jump, and is located after the last jumping branch terminal on the branch line;
   when two sub-meters in the transformer area have reverse load jumps, directly matching single load jump features of the two sub-meters one by one to find a position of each jumping sub-meter, and determining that two jumps occur on two branches; when the position of any one of the sub-meters is incapable of being found, determining that the two sub-meters are at a same point on the same branch, and at this time, when a difference between the two jumps is large, calculating a combined jump value of the two jumps, and then processing the combined jump value according to a single jump to find a position of a combined jump in the branch topology, wherein the position of the combined jump is a common position of the two jumping sub-meters; and when only one sub-meter is capable of being found, determining that the two sub-meters are located after different branch terminals of the same branch, and the other sub-meter is located before the first branch terminal with the load jump value changing greatly compared with a previous branch terminal on the branch; and when two sub-meters in the transformer area have load jumps in a same direction, and the jump values are quite different, first calculating a combined jump value of the jumps, then processing the combined jump value according to the single jump to find a position of the combined jump in the branch topology, and then matching single load jump features of the two sub-meters one by one from this position to find the position of each jumping sub-meter; when the position of any one of the sub-meters is incapable of being found, determining that the two sub-meters are at the same point on the same branch, and the position of the combined jump is a common position of the two jumping sub-meters; and when the position of only one sub-meter is capable of being found, determining that the position of the other sub-meter is the position of the combined jump.

8. The method for constructing the transformer area line topology according to claim 7, wherein step S600 further comprises the following sub-steps:

performing high-frequency data acquisition on all the sub-meters and the branch terminals in the transformer area to obtain load transient change features, matching load transient change features of all the sub-meters with load transient change features of all the branch terminals, and when one sub-meter shows the load transient change features, and load of the remaining sub-meters fluctuates smoothly, determining that the jumping sub-meter is located on the branch showing the same load transient change features, and is located after the last jumping branch terminal on the branch; and when two sub-meters show the load transient change features, and load of the remaining sub-meters fluctuates smoothly, first calculating combined load transient change features of the two jumping sub-meters, then processing the combined load transient change features according to the single jump to find the branch terminal corresponding to the combined load transient change features in the branch topology, and continuing to match the respective load transient change features of each jumping sub-meter from the branch terminal, so as to find the position of each jumping sub-meter.

\* \* \* \* \*